United States Patent
Camacho et al.

(10) Patent No.: US 8,502,358 B2
(45) Date of Patent: Aug. 6, 2013

(54) INTEGRATED CIRCUIT PACKAGING SYSTEM WITH MULTI-ROW LEADS AND METHOD OF MANUFACTURE THEREOF

(75) Inventors: Zigmund Ramirez Camacho, Singapore (SG); Henry Descalzo Bathan, Singapore (SG); Emmanuel Espiritu, Singapore (SG)

(73) Assignee: Stats Chippac Ltd., Singapore (SG)

( * ) Notice: Subject to any disclaimer, the term of this patent is extended or adjusted under 35 U.S.C. 154(b) by 189 days.

(21) Appl. No.: 12/957,339

(22) Filed: Nov. 30, 2010

(65) Prior Publication Data

US 2012/0133033 A1 May 31, 2012

(51) Int. Cl.
- H01L 23/495 (2006.01)
- H01L 23/02 (2006.01)
- H01L 23/28 (2006.01)
- H01L 23/48 (2006.01)
- H01L 23/053 (2006.01)

(52) U.S. Cl.
USPC ........... 257/666; 257/678; 257/787; 257/690; 257/700

(58) Field of Classification Search
USPC ................. 257/666, 678, 687, 787, 739, 748, 257/690, 691, 692, 700, 773, 784
See application file for complete search history.

(56) References Cited

U.S. PATENT DOCUMENTS

| | | | | |
|---|---|---|---|---|
| 6,376,921 B1 * | 4/2002 | Yoneda et al. | | 257/787 |
| 6,573,121 B2 | 6/2003 | Yoneda et al. | | |
| 7,157,308 B2 * | 1/2007 | Takano | | 438/106 |
| 7,202,460 B2 * | 4/2007 | Onodera et al. | | 250/208.1 |
| 7,402,459 B2 | 7/2008 | Xiaochun et al. | | |
| 2009/0302452 A1 * | 12/2009 | Camacho et al. | | 257/692 |

* cited by examiner

*Primary Examiner* — Chuong A. Luu
(74) *Attorney, Agent, or Firm* — Ishimaru & Associates LLP

(57) ABSTRACT

A method of manufacture of an integrated circuit packaging system includes: forming a base structure having an intermediate lead with an intermediate concave side and an intermediate convex side, a peripheral lead with a peripheral concave side and a peripheral convex side, and a paddle with a paddle concave side and a paddle convex side; applying an inner multi-layer finish directly on the intermediate concave side, the peripheral concave side, and the paddle concave side; applying an outer multi-layer finish directly on the intermediate convex side, the peripheral convex side, and the paddle convex side; mounting an integrated circuit device over the inner multi-layer finish; attaching an interconnect directly to the inner multi-layer finish on the peripheral concave side and directly to integrated circuit device; and applying an encapsulation over the integrated circuit device, the interconnect, and the base structure, with the outer multi-layer finish exposed from the encapsulation.

10 Claims, 5 Drawing Sheets

INTEGRATED CIRCUIT PACKAGING SYSTEM WITH MULTI-ROW LEADS AND METHOD OF MANUFACTURE THEREOF

TECHNICAL FIELD

The present invention relates generally to an integrated circuit packaging system, and more particularly to a system with leads.

BACKGROUND ART

Electronic products such as cell phone base products, global positioning systems (GPS), satellites, communication equipment, consumer products, and a vast line of other similar products are in ever increasing global demand. It is very important for products to continue to improve in features, performance, and reliability while reducing product costs, product size, and to be available quickly for purchase by the consumers or buyers.

Products must be capable of competing in world markets and attracting many consumers or buyers. Market growth for high density and high output/input integrated circuit packages has resulted in a trend for electronic products that are lightweight, smaller in size, multi-functional, and capable of ever increasing higher speeds.

Smaller packages need to be electrically connected with other parts and components. As the smaller packages with more circuits continue to get shrink in size, there is a greater need to produce the smaller packages at a reduced cost with increases in product yields and product reliability.

Thus, an increasing need remains to increase manufacturing throughput and the product reliability while reducing costs as a result of manufacturing scrap and rework of parts. It is also critical that the smaller packages are easily manufactured using automated packaging machinery. Smaller packages must be able to connect to circuit boards and deliver increasing functionality, speed, and performance. In view of the economic and technological challenges, it is increasingly critical that answers be found to these problems.

In view of the ever-increasing commercial competitive pressures, along with growing consumer expectations and the diminishing opportunities for meaningful product differentiation in the marketplace, it is critical that answers be found for these problems. Additionally, the need to reduce costs, improve reliability and product yields to meet competitive pressures adds an even greater urgency to the critical necessity for finding answers to these problems.

Solutions to these problems have been long sought after but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a base structure having an intermediate lead with an intermediate concave side and an intermediate convex side, a peripheral lead with a peripheral concave side and a peripheral convex side, and a paddle with a paddle concave side and a paddle convex side; applying an inner multi-layer finish directly on the intermediate concave side, the peripheral concave side, and the paddle concave side; applying an outer multi-layer finish directly on the intermediate convex side, the peripheral convex side, and the paddle convex side; mounting an integrated circuit device over the inner multi-layer finish; attaching an interconnect directly to the inner multi-layer finish on the peripheral concave side and directly to integrated circuit device; and applying an encapsulation over the integrated circuit device, the interconnect, and the base structure, with the outer multi-layer finish exposed from the encapsulation.

The present invention provides an integrated circuit packaging system, including: a base structure having an intermediate lead with an intermediate concave side and an intermediate convex side, a peripheral lead with a peripheral concave side and a peripheral convex side, and a paddle with a paddle concave side and a paddle convex side; an inner multi-layer finish directly on the intermediate concave side, the peripheral concave side, and the paddle concave side; an outer multi-layer finish directly on the intermediate convex side, the peripheral convex side, and the paddle convex side; an integrated circuit device over the inner multi-layer finish; an interconnect attached directly to the inner multi-layer finish on the peripheral concave side and directly to integrated circuit device; and an encapsulation over the integrated circuit device, the interconnect, and the base structure, with the outer multi-layer finish exposed from the encapsulation.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
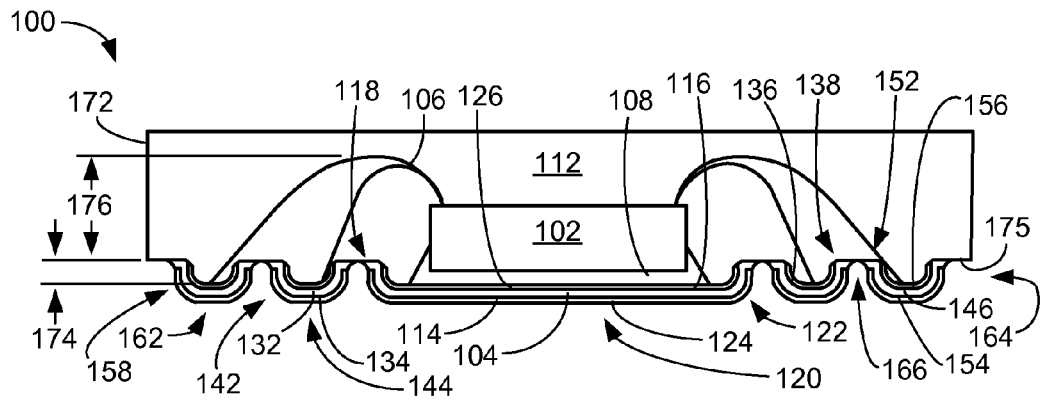
FIG. 1 is a cross-sectional view of an integrated circuit packaging system in a first embodiment of the present invention taken along line 1-1 of FIG. 2.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown greatly exaggerated in the drawing FIGs. Similarly, although the views in the drawings are shown for ease of description and generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the present invention, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Figure 2:
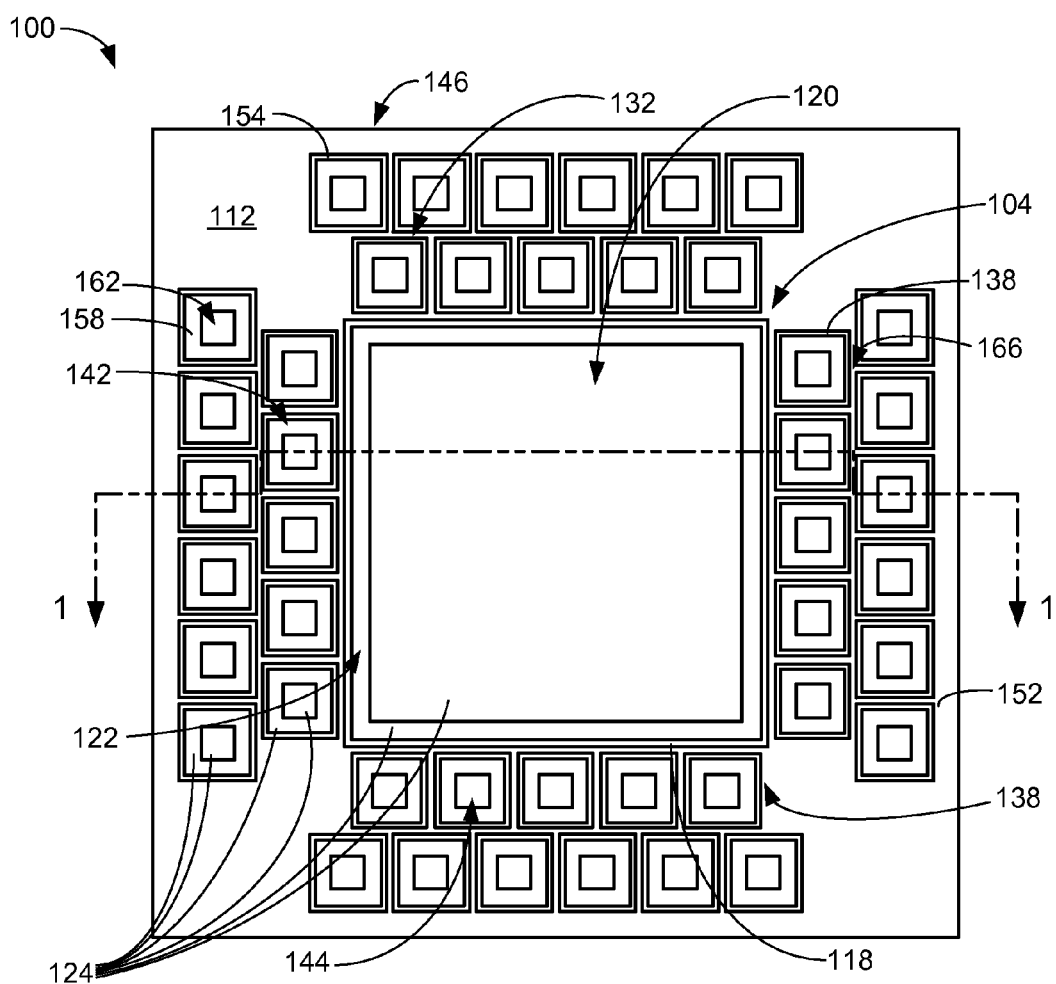
FIG. 2 is a bottom view of the integrated circuit packaging system of FIG. 1.

Referring now to FIG. 1, therein is shown a cross-sectional view of an integrated circuit packaging system 100 in a first embodiment of the present invention taken along line 1-1 of FIG. 2. The integrated circuit packaging system 100 includes an integrated circuit device 102 over a paddle 104, interconnects 106, an attachment layer 108, and an encapsulation 112 used to protect and hermetically seal the contents of the integrated circuit packaging system 100.

The paddle 104 includes a paddle convex side 114 and a paddle concave side 116 opposite the paddle convex side 114. The paddle 104 can be formed by stamping of a conductive and malleable material that can include a copper or a copper alloy material. Ends of the paddle concave side 116 and ends of the paddle convex side 114 intersect one another to form a paddle tapered edge 118.

The paddle tapered edge 118 is defined an edge formed by an intersection of a curved surface region of the paddle concave side 116 and of a horizontal surface region of the paddle convex side 114. The ends of the paddle convex side 114 have a cross-sectional profile that is convex shaped. The ends of the paddle concave side 116 have a cross-sectional profile that is concave shaped.

The paddle 104 can be formed having a paddle bulge 120 or protrusion as a result of a paddle curved section 122 of the paddle 104. The paddle curved section 122 includes the ends of the paddle convex side 114 having the convex shaped cross-sectional profile and the paddle concave side 116 having the concave shaped cross-sectional profile. The paddle bulge 120 of the paddle 104 can be planar.

The paddle convex side 114 can be covered with an outer multi-layer finish 124. The outer multi-layer finish 124 can be formed with multiple plated layers of conductive material that can have three or more layers. The multiple plated layers of the conductive material can include nickel-palladium-gold layers.

The paddle concave side 116 can be covered with an inner multi-layer finish 126. The inner multi-layer finish 126 can be formed with multiple plated layers of conductive material that can have more than two layers. The conductive material can include the outer multi-layer finish 124, gold-palladium-nickel-palladium layers, nickel-palladium-silver layers, or any combination thereof. The paddle tapered edge 118 is exposed from the outer multi-layer finish 124 and the inner multi-layer finish 126.

Intermediate leads 132 can be formed around the paddle 104. The intermediate leads 132 can be formed and shaped in a manner similar to the paddle 104 except the intermediate leads 132 have a width that is less than one third of a width of the paddle 104. The intermediate leads 132 can be formed from a material similar to the material of the paddle 104.

The intermediate leads 132 include an intermediate convex side 134, an intermediate concave side 136, a lead tapered edge 138, and a lead curved section 142 in a manner similar to the paddle convex side 114, the paddle concave side 116, the paddle tapered edge 118, and the paddle curved section 122, respectively. The intermediate leads 132 also include a lead bulge 144 in a manner similar to the paddle bulge 120.

The intermediate convex side 134 can be coplanar with the paddle convex side 114. The inner multi-layer finish 126 and the outer multi-layer finish 124 can cover the intermediate concave side 136 and the intermediate convex side 134 in a manner similar to the paddle concave side 116 and the paddle convex side 114, respectively.

Peripheral leads 146 can be formed outside a perimeter region having the intermediate leads 132 and the paddle 104. More than one row of the intermediate leads 132 can be located between a row of the peripheral leads 146 and the paddle 104.

The peripheral leads 146 can be formed from a material similar to the material of the paddle 104. The peripheral leads 146 include a peripheral tapered edge 152, a peripheral convex side 154, a peripheral concave side 156, and a peripheral curved section 158 in a manner similar to the lead tapered edge 138, the intermediate convex side 134, the intermediate concave side 136, and the lead curved section 142, respectively. The peripheral leads 146 also include a peripheral lead bulge 162 in a manner similar to the lead bulge 144.

The peripheral tapered edge 152 is exposed from the inner multi-layer finish 126 and the outer multi-layer finish 124.

The inner multi-layer finish 126 and the outer multi-layer finish 124 can cover the peripheral concave side 156 and the peripheral convex side 154 in a manner similar to the intermediate concave side 136 and the intermediate convex side 134, respectively. The peripheral convex side 154 can be coplanar with the intermediate convex side 134.

The integrated circuit device 102 can be mounted to the inner multi-layer finish 126 on the paddle concave side 116 using the attachment layer 108 that can include an adhesive layer, a stacking adhesive, or a combination thereof. Circuitry of the integrated circuit device 102 can be directly connected or attached to an end of the interconnects 106 that can include wire, wire bond wire, or a combination thereof.

An end of the interconnects 106 opposite the end of the interconnects 106 directly connected to the circuitry can be directly attached to the inner multi-layer finish 126 on the intermediate concave side 136 or on the peripheral concave side 156. A section of the end of the interconnects 106 directly connected to the inner multi-layer finish 126 on the intermediate concave side 136 of the intermediate leads 132 can be supported by the lead tapered edge 138 to provide structural support and eliminate connective defects, such as opens or shorts.

A section of the end of the interconnects 106 directly connected to the inner multi-layer finish 126 on the peripheral concave side 156 of the peripheral leads 146 can be supported by the peripheral tapered edge 152 to provide structural support and eliminate connective defects, such as opens or shorts. The interconnects 106 provide connectivity between the circuitry and the intermediate leads 132 or the peripheral leads 146.

The paddle 104, the intermediate leads 132, and the peripheral leads 146 are isolated from one another by the encapsulation 112. A base structure 164 of the integrated circuit packaging system 100 can be defined as the paddle 104, the intermediate leads 132, and the peripheral leads 146, laterally aligned and formed using a stamping process or a cold working process.

The encapsulation 112 can cover the interconnects 106, the integrated circuit device 102, the attachment layer 108, and the base structure 164. The encapsulation 112 can be exposed in grooves 166 or channels etched between and separating adjacent pairs of the peripheral leads 146 and the intermediate leads 132 and adjacent pairs of the intermediate leads 132 and the paddle 104.

The grooves 166 can be formed by the paddle tapered edge 118 facing and adjacent the lead tapered edge 138 or by the lead tapered edge 138 facing and adjacent the peripheral tapered edge 152 adjacent pair. The grooves 166 can also be formed by the lead tapered edge 138 facing and adjacent a further lead tapered edge 138 or by the peripheral tapered edge 152 facing and adjacent a further peripheral tapered edge 152.

The grooves 166 can be located between regions of the base structure 164 covered by the outer multi-layer finish 124 and formed by facing pairs of the paddle tapered edge 118 and the lead tapered edge 138 or of the lead tapered edge 138 and the peripheral tapered edge 152.

The base structure 164 can have a punch depth 174 less than or equal to a thickness of the integrated circuit device 102. The punch depth 174 is defined as a maximum vertical distance from an base encapsulation side 175 of the encapsulation 112 to the peripheral concave side 156, the intermediate concave side 136, or the paddle concave side 116. A loop height 176 is defined as a vertical height from the base encapsulation side 175 to a point of the interconnects 106 furthest above the peripheral concave side 156.

It has been discovered that the paddle bulge 120 and the paddle curved section 122, the lead bulge 144 and the lead curved section 142, or the peripheral lead bulge 162 and the peripheral curved section 158 provides additional surface contact with the encapsulation 112 to provide improved adhesion characteristics with the encapsulation 112. The superior adhesion characteristics include improved resistance from separation, shifting, peeling, twisting, or prying from the encapsulation 112.

It has been discovered that the grooves 166 formed by different paired combinations of the paddle tapered edge 118, the lead tapered edge 138, or the peripheral tapered edge 152 increase product throughput by simplifying the removal or etching process and processing time to isolate regions of the base structure 164. The etching of the grooves 166 need only remove minimal amounts of conductive leadframe material to isolate the regions of the base structure 164 as opposed to typical quad flat no lead multiple row packages which require significantly greater amounts of removal, over etching, or selective etching of leadframe material.

It has been discovered that the interconnects 106 structurally supported by the lead tapered edge 138 of the intermediate leads 132 eliminates connective defects of the interconnects 106 to the intermediate leads 132 by reducing wire sweeps thereby increasing reliability.

It has been discovered that the interconnects 106 structurally supported by the peripheral tapered edge 152 of the peripheral leads 146 eliminates connective defects of the interconnects 106 to the peripheral leads 146.

It has been discovered that the inner multi-layer finish 126 with the multiple plated layers of the conductive material improves joining or bonding characteristics between the base structure 164 and the interconnects 106.

It has been discovered that the outer multi-layer finish 124 with the multiple plated layers of the conductive material improves solder joint reliability between the next level of integration and the paddle bulge 120, the lead bulge 144, or the peripheral lead bulge 162.

It has been discovered that increasing the punch depth 174 of the base structure 164 reduces the loop height 176 resulting package heights less than package heights of quad flat no lead multiple row package having etched leads.

Referring now to FIG. 2, therein is shown a bottom view of the integrated circuit packaging system of FIG. 1. The paddle 104, the intermediate leads 132, and the peripheral leads 146 is shown covered with the outer multi-layer finish 124 and exposed from the encapsulation 112.

For purposes of illustration and clarity, the paddle 104, the intermediate leads 132, and the peripheral leads 146 are shown having a shape of a rectangle. The paddle 104, the intermediate leads 132, or the peripheral leads 146 can have any shape. The intermediate leads 132 can have a shape of a circle, as an example.

The paddle tapered edge 118, the lead tapered edge 138, or the peripheral tapered edge 152 can surround the outer multi-layer finish 124. The paddle bulge 120, the lead bulge 144, or the peripheral lead bulge 162 can be attached to a next level of integration such as a printed circuit board, an integrated circuit package, or an integrated circuit component to provide connectivity to the circuitry of the present embodiment.

The paddle bulge 120, the lead bulge 144, and the peripheral lead bulge 162 are surrounded by the paddle curved section 122, the lead curved section 142, and the peripheral curved section 158, respectively. The grooves 166 can be formed from different paired adjacent combinations of the peripheral leads 146, the intermediate leads 132, and the paddle 104.

Figure 3:
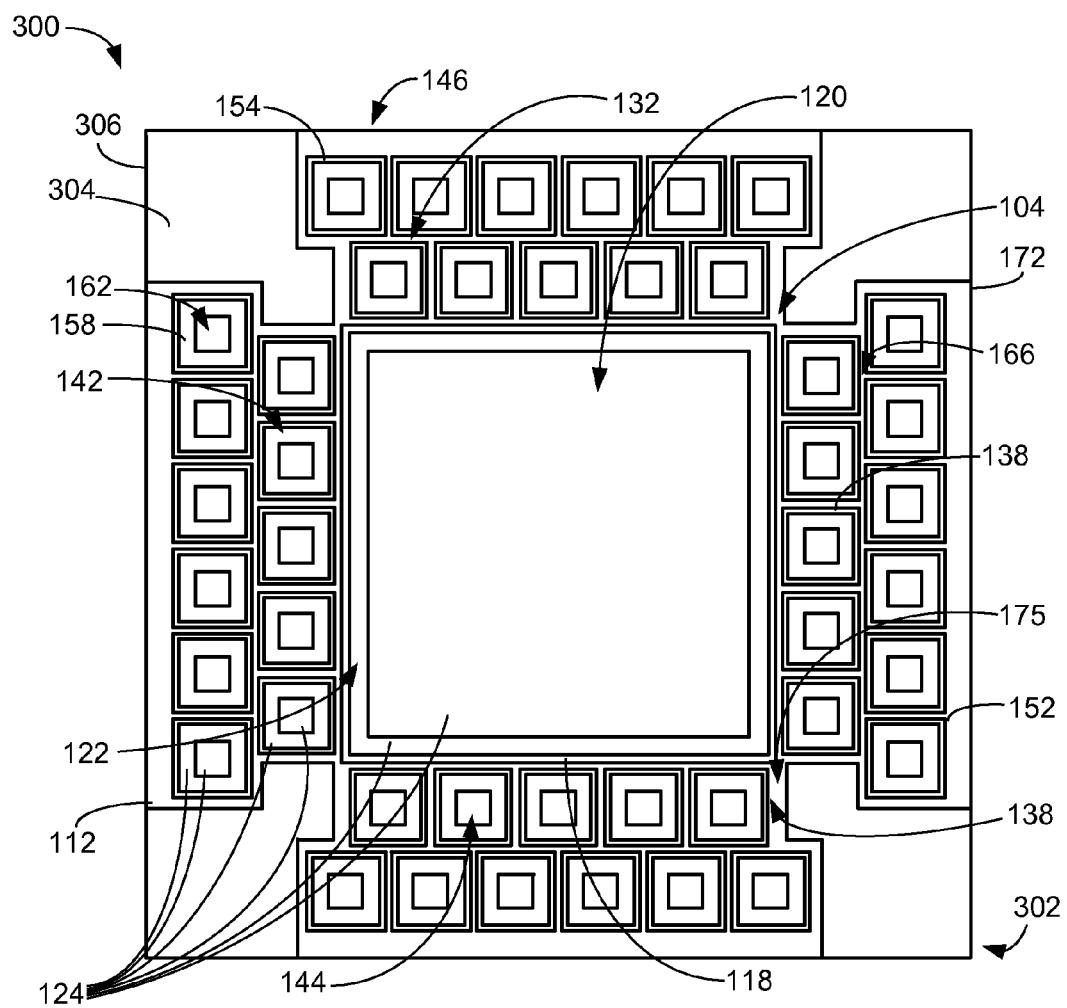
FIG. 3 is a bottom view of an integrated circuit packaging system in a second embodiment of the present invention.

Referring now to FIG. 3, therein is shown a bottom view of an integrated circuit packaging system 300 in a second embodiment of the present invention. The present embodiment is similar to the integrated circuit packaging system 100 except the present embodiment includes corner panels 302.

The integrated circuit packaging system 300 includes the base structure 164 of FIG. 1 having the paddle 104, the intermediate leads 132, and the peripheral leads 146. The paddle tapered edge 118, the lead tapered edge 138, or the peripheral tapered edge 152 is shown surrounding the outer multi-layer finish 124.

The paddle bulge 120, the lead bulge 144, or the peripheral lead bulge 162 can be attached to a next level of integration such as a printed circuit board, an integrated circuit package, or an integrated circuit component to provide connectivity to the circuitry of the present embodiment. The paddle bulge 120, the lead bulge 144, and the peripheral lead bulge 162 are surrounded by the paddle curved section 122, the lead curved section 142, and the peripheral curved section 158, respectively. The grooves 166 can be formed from different paired adjacent combinations of the peripheral leads 146, the intermediate leads 132, and the paddle 104.

The corner panels 302 can be formed of the same material as the paddle 104, copper, or copper alloy material and located at corners of the base structure 164. The corner panels 302 intersect the encapsulation sides 172 of the encapsulation 112. The encapsulation 112 electrically isolates and separates the corner panels 302 from the base structure 164.

The corner panels 302 can be used to provide additional thermal dissipation or electromagnetic shielding to the integrated circuit packaging system 300. An outer panel side 304 can cover the base encapsulation side 175 of the encapsulation 112. Panel edges 306 can be coplanar with the encapsulation sides 172 of the encapsulation 112.

It has been discovered that the corner panels 302 in combination with the base structure 164 provide the integrated circuit packaging system 300 with better thermal dissipation and electromagnetic shielding than typical quad flat no lead multiple row packages.

Figure 4:
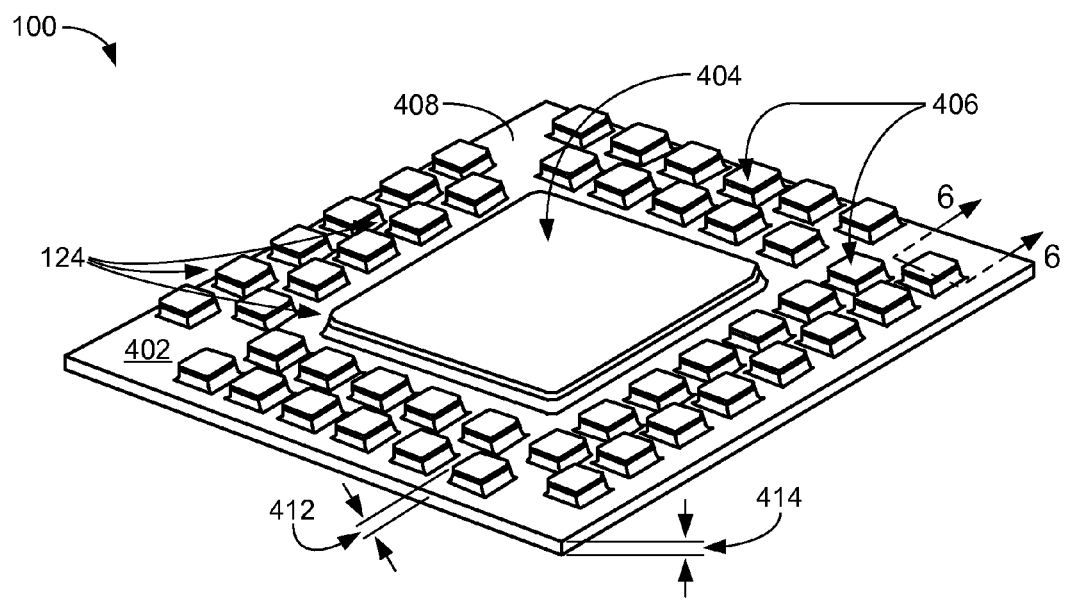
FIG. 4 is a bottom isometric view of FIG. 1 in a leadframe forming phase of manufacture.

Referring now to FIG. 4, therein is shown a bottom isometric view of FIG. 1 in a leadframe forming phase of manufacture. A leadframe 402 formed of the conductive and malleable material of the paddle 104 of FIG. 1 can be stamped during the forming phase. A stamping process or cold working process can be used during the forming phase to form a main protrusion 404 and lead protrusions 406 extending over an outer frame side 408 of the leadframe 402.

The main protrusion 404 is formed at locations on the leadframe 402 identical to locations of the corresponding to the paddle 104. The lead protrusions 406 are formed on the leadframe 402 at locations on the leadframe 402 identical to locations of the lead bulge 144 of FIG. 2 of the intermediate leads 132 of FIG. 2 and the peripheral lead bulge 162 of the peripheral leads 146 of FIG. 2.

The stamping process or cold working process can include embossing, stamping, or coining of the leadframe 402 using equipment (not shown) such as a blank feeder machine or a stamping machine. The stamping process can precede or follow a plating process used to form the outer multi-layer finish 124 used to cover the main protrusion 404 and the lead protrusions 406.

The plating process can a process that includes a vacuum chamber (not shown) electroplating, electroless plating, vapor deposition, sputter deposition, flash deposition, or any combination thereof. The outer frame side 408 is exposed from the outer multi-layer finish 124.

The main protrusion 404 and the lead protrusions 406 extend a leadframe height 412 over the outer frame side 408. The leadframe height 412 is defined as a maximum distance measured vertically from the outer frame side 408 to surfaces of the main protrusion 404 or of the lead protrusions 406 furthest above the outer frame side 408.

The leadframe height 412 can be at least four times a leadframe thickness 414 of the leadframe 402. The leadframe thickness 414 is defined as minimum thickness between the outer frame side 408 and a side of the leadframe 402 opposite the outer frame side 408.

The leadframe height 412 is equivalent to heights of the paddle 104 of FIG. 1, of the intermediate leads 132 of FIG. 1, and of the peripheral leads 146 of FIG. 1. The package standoff height of the present invention is defined to be equivalent to the leadframe height.

It has been discovered that the package standoff height of the paddle 104, the intermediate leads 132, and the peripheral leads 146 provide improved standoff height. For example, the paddle 104, the intermediate leads 132, and the peripheral leads 146 provide a significantly higher package standoff height compared to typical quad flat no lead multiple row packages.

It has been unexpectedly found that having the plating process precede the stamping process provides plated reference markers for a stamping machine (not shown) to accurately locate and form the main protrusion 404 and the lead protrusions 406 used to manufacture the base structure 164.

It has been unexpectedly ascertained that the paddle 104, the intermediate leads 132, and the peripheral leads 146 formed using a stamping process and the leadframe 402 costs less than a typical die paddle or package lead formed using an etching.

Figure 5:
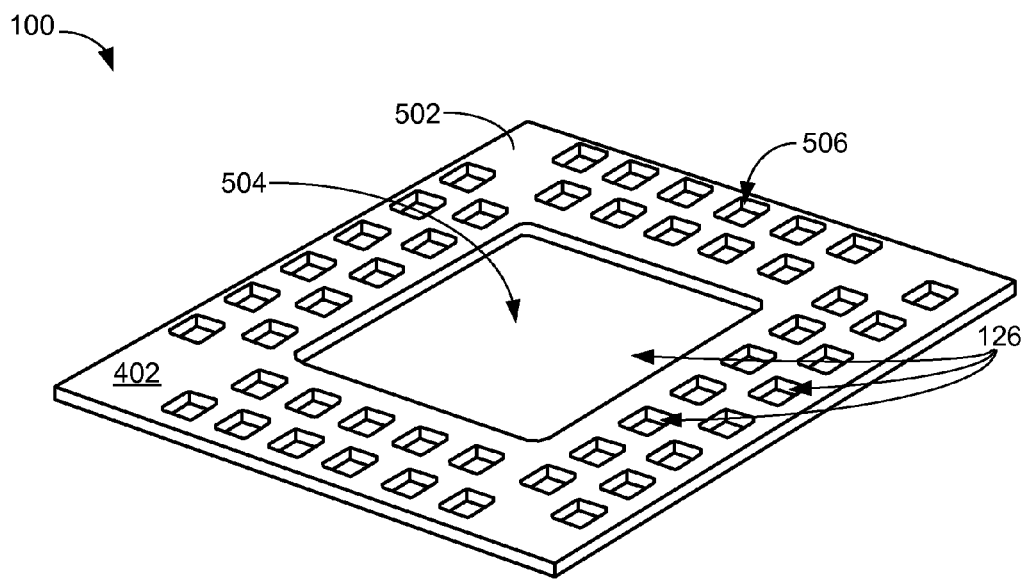
FIG. 5 is a top isometric view of FIG. 4.

Referring now to FIG. 5, therein is shown a top isometric view of FIG. 4. Shown are an inner frame side 502 of the leadframe 402, main inward sides 504 of the main protrusion 404 of FIG. 4, and lead inward sides 506 of the lead protrusions 406 of FIG. 4. The main inward sides 504 and the lead inward sides 506 can be covered with the inner multi-layer finish 126 during the plating process. The inner frame side 502 is exposed from the inner multi-layer finish 126.

Figure 6:
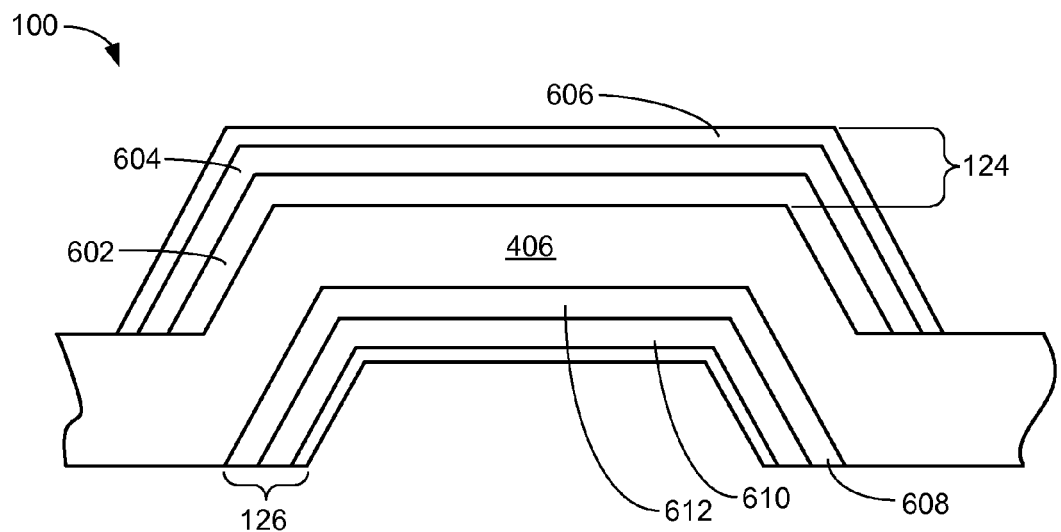
FIG. 6 is a cross-sectional view of a portion of FIG. 4 taken along line 6-6.

Referring now to FIG. 6, therein is shown a cross-sectional view of a portion of FIG. 4 taken along line 6-6. The outer multi-layer finish 124 is shown in greater detail. The outer multi-layer finish 124 includes a layer of nickel metal 602, a layer of palladium metal 604, and a layer of gold metal 606. The layer of nickel metal 602 can be plated directly on the lead protrusions 406 using the plating process.

The layer of palladium metal 604 can be plated directly on the layer of nickel metal 602 using the plating process. The layer of gold metal 606 or gold flash can be plated directly on the layer of palladium metal 604 using the plating process.

The inner multi-layer finish 126 is shown in greater detail. The inner multi-layer finish 126 includes a base layer 608, a middle layer 610, and a top layer 612. The base layer 608 can be formed of a nickel layer or of a palladium layer covered with a nickel layer.

The base layer 608 can be plated directly on the lead protrusions 406. The middle layer 610 can be formed of a palladium layer and plated directly on the base layer 608. The top layer 612 can be formed of a gold layer or a silver layer.

The top layer 612 can be plated directly on the middle layer 610. The outer multi-layer finish 124 and the inner multi-layer finish 126 can be formed of and applied on the main protrusion 404 of FIG. 4 in a manner similar to the outer multi-layer finish 124 and the inner multi-layer finish 126 on the lead protrusions 406.

Figure 7:
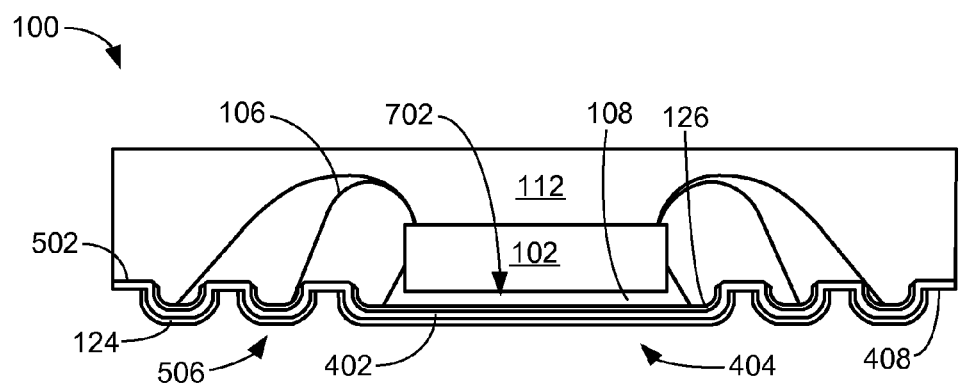
FIG. 7 is the cross-sectional view of FIG. 1 in an encapsulation phase.

Referring now to FIG. 7, therein is shown the cross-sectional view of FIG. 1 in an encapsulation phase. The integrated circuit device 102 can be mounted to a die area 702 on the inner multi-layer finish 126 of the main protrusion 404 using the attachment layer 108. Ends of the interconnects 106 can be directly attached to the circuitry of the integrated circuit device 102 and to the inner multi-layer finish 126 on the lead inward sides 506.

The inner frame side 502, the integrated circuit device 102, the interconnects 106, the attachment layer 108, and the inner multi-layer finish 126 can be covered with the encapsulation 112 during the encapsulation phase. Perimeter sides of the leadframe 402, the outer frame side 408, and the outer multi-layer finish 124 are exposed from the encapsulation 112. The encapsulation phase includes an encapsulation process.

Figure 8:
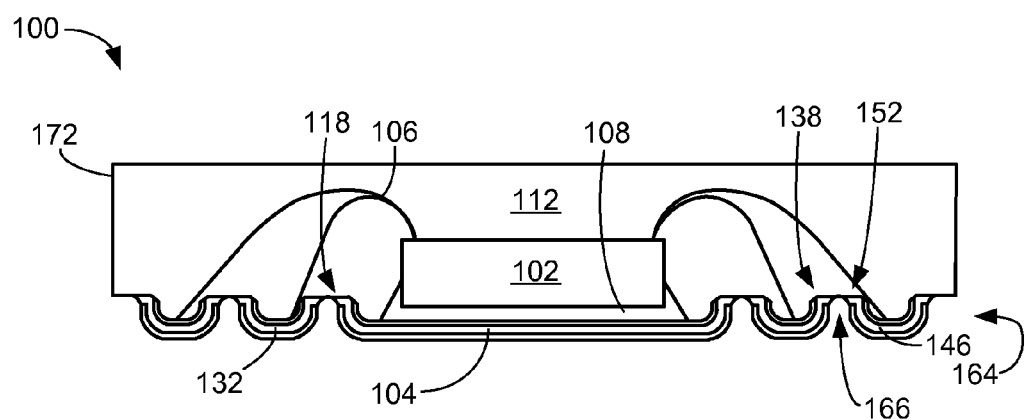
FIG. 8 is the cross-sectional view of FIG. 6 in an etching phase.

Referring now to FIG. 8, therein is shown the cross-sectional view of FIG. 6 in an etching phase. Portions of the leadframe 402 of FIG. 7 exposed between regions of the leadframe 402 having the outer multi-layer finish 124 can be divided or separated apart to expose the encapsulation 112 during an etching process. The etching process can include a strip etch, a line etch, or an area etch of the portions of the leadframe 402.

The grooves 166 are formed during the etching process. The separation of the regions having the outer multi-layer finish 124 result in the formation of the paddle 104, the intermediate leads 132, and the peripheral leads 146 of the base structure 164.

The base structure 164, the grooves 166, and the encapsulation 112 covering the base structure 164, the integrated circuit device 102, the interconnects 106, and the attachment layer 108 form the integrated circuit packaging system 100 of FIG. 1.

It has been discovered that the stamping or cold working used to form the paddle 104, the intermediate leads 132, and the peripheral leads 146 provides superior strength leads.

It has been discovered that the outer multi-layer finish 124 improves the etching process by providing better control of etchant applied to the leadframe due to the inherent masking properties of the outer multi-layer finish 124.

Figure 9:
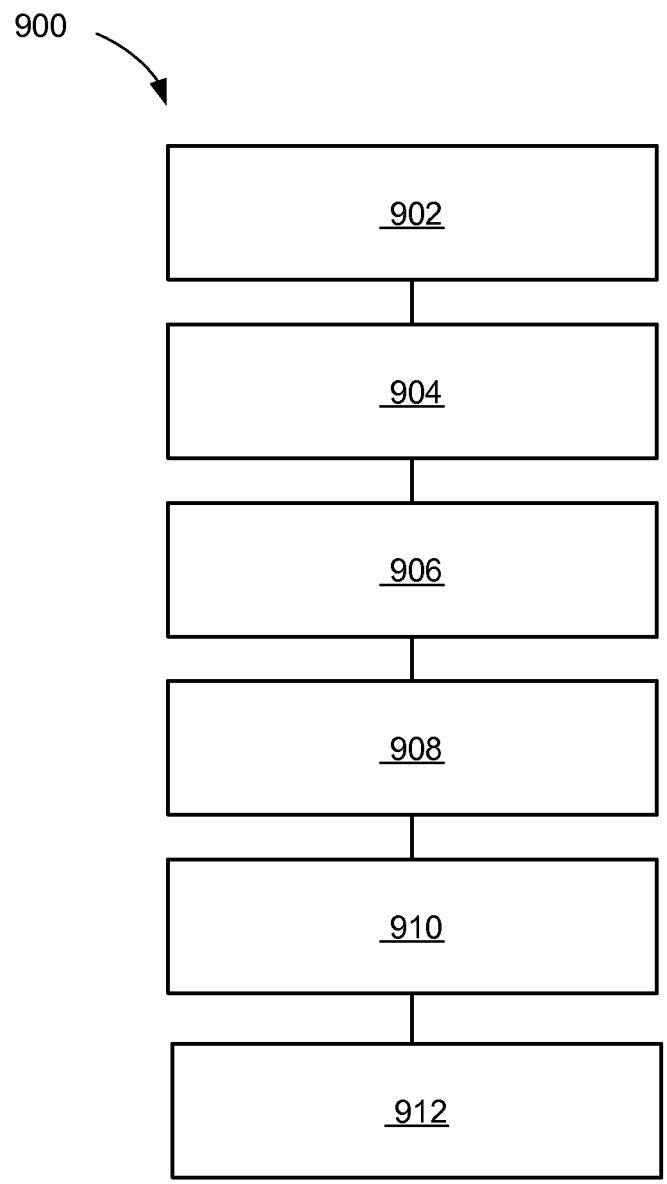
FIG. 9 is a flow chart of a method of manufacture of the integrated circuit packaging system in a further embodiment of the present invention.

Referring now to FIG. 9, therein is shown a flow chart of a method 900 of manufacture of the integrated circuit packaging system 100 in a further embodiment of the present invention. The method 900 includes: forming a base structure having an intermediate lead with an intermediate concave side and an intermediate convex side, a peripheral lead with a peripheral concave side and a peripheral convex side, and a paddle with a paddle concave side and a paddle convex side in a block 902; applying an inner multi-layer finish directly on the intermediate concave side, the peripheral concave side, and the paddle concave side in a block 904; applying an outer multi-layer finish directly on the intermediate convex side, the peripheral convex side, and the paddle convex side in a block 906; mounting an integrated circuit device over the inner multi-layer finish in a block 908; attaching an interconnect directly to the inner multi-layer finish on the peripheral concave side and directly to integrated circuit device in a block 910; and applying an encapsulation over the integrated circuit device, the interconnect, and the base structure, with the outer multi-layer finish exposed from the encapsulation in a block 912.

Thus, it has been discovered that the integrated circuit packaging system with the present invention furnishes important and heretofore unknown and unavailable solutions, capabilities, and functional aspects. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing package in package systems/fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit packaging system comprising:
a base structure having an intermediate lead with an intermediate concave side and an intermediate convex side, a peripheral lead with a peripheral concave side and a peripheral convex side, and a paddle with a paddle concave side and a paddle convex side;
an inner multi-layer finish directly on the intermediate concave side, the peripheral concave side, and the paddle concave side;
an outer multi-layer finish directly on the intermediate convex side, the peripheral convex side, and the paddle convex side;
an integrated circuit device over the inner multi-layer finish;
an interconnect attached directly to the inner multi-layer finish on the peripheral concave side and directly to integrated circuit device; and
an encapsulation over the integrated circuit device, the interconnect, and the base structure, with the outer multi-layer finish exposed from the encapsulation.

2. The system as claimed in claim 1 wherein the base structure includes a groove formed from edges of the intermediate lead, the peripheral lead, and the paddle.

3. The system as claimed in claim 1 wherein the base structure includes a punch depth less than a thickness of the integrated circuit device.

4. The system as claimed in claim 1 wherein the interconnect includes a section of the interconnect supported by a peripheral tapered edge of the peripheral lead.

5. The system as claimed in claim 1 further comprising a corner panel at a corner of the base structure.

6. The system as claimed in claim 1 further comprising a second interconnect attached directly to the inner multi-layer finish on the intermediate concave side and directly to the integrated circuit device.

7. The system as claimed in claim 6 wherein the base structure includes a groove formed from edges of the intermediate lead, the peripheral lead, and the paddle to expose the encapsulation.

8. The system as claimed in claim 6 wherein the base structure includes a punch depth equal to a thickness of the integrated circuit device.

9. The system as claimed in claim 6 wherein the second interconnect includes a section of the second-the interconnect supported by a lead tapered edge of the intermediate lead.

10. The system as claimed in claim 6 further comprising a corner panel at a corner of the base structure, the encapsulation intersected by the corner panel.

* * * * *